United States Patent
Valentin et al.

(10) Patent No.: US 9,910,368 B2
(45) Date of Patent: Mar. 6, 2018

(54) PATTERNING DEVICE MANIPULATING SYSTEM AND LITHOGRAPHIC APPARATUSES

(71) Applicants: ASML Netherlands B.V., Veldhoven (NL); ASML Holding N.V., Veldhoven (NL)

(72) Inventors: Christiaan Louis Valentin, Eindhoven (NL); Erik Roelof Loopstra, Eindhoven (NL); Christopher Charles Ward, Somerville, MA (US); Daniel Nathan Burbank, Ridgefield, CT (US); Mark Josef Schuster, Fairfield, CT (US); Peter James Graffeo, Stratford, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 14/437,294

(22) PCT Filed: Sep. 20, 2013

(86) PCT No.: PCT/EP2013/069547
§ 371 (c)(1),
(2) Date: Apr. 21, 2015

(87) PCT Pub. No.: WO2014/063871
PCT Pub. Date: May 1, 2014

(65) Prior Publication Data
US 2015/0277241 A1    Oct. 1, 2015

Related U.S. Application Data

(60) Provisional application No. 61/717,208, filed on Oct. 23, 2012.

(51) Int. Cl.
*G03F 7/20* (2006.01)

(52) U.S. Cl.
CPC .......... *G03F 7/70783* (2013.01); *G03F 7/707* (2013.01); *G03F 7/70266* (2013.01);
(Continued)

(58) Field of Classification Search
CPC .. G03F 7/707; G03F 7/70758; G03F 7/70783; G03F 7/70725; G03F 7/70266;
(Continued)

(56) References Cited

U.S. PATENT DOCUMENTS

2008/0013068 A1   1/2008   Jeunink et al.
2008/0024741 A1   1/2008   Butler et al.
(Continued)

FOREIGN PATENT DOCUMENTS

| | | |
|---|---|---|
| JP | 11-354435 A | 12/1999 |
| JP | 2001-109160 A | 4/2001 |
| JP | 2008-034844 A | 2/2008 |

OTHER PUBLICATIONS

International Search Report directed to related International Patent Application No. PCT/EP2013/069547, dated Jan. 7, 2014; 4 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

A system (300) for supporting an exchangeable object (302) can include a movable structure (304) and an object holder (306) configured to be movable relative to the movable structure. The object holder can be configured to hold the exchangeable object. The system can also include a first actuator assembly (308) and second actuator assembly (316). The first actuator assembly can be configured to apply a force to the object holder to translate the exchangeable (Continued)

object generally along a plane. The second actuator assembly can be configured to apply a bending moment to the object holder. The exchangeable object can be a patterning device of a lithographic apparatus.

47 Claims, 6 Drawing Sheets

(52) U.S. Cl.
CPC ...... *G03F 7/70433* (2013.01); *G03F 7/70725* (2013.01); *G03F 7/70758* (2013.01); *G03F 7/70775* (2013.01); *G03F 7/70825* (2013.01)

(58) Field of Classification Search
CPC ............. G03F 7/70433; G03F 7/70775; G03F 7/70825
See application file for complete search history.

(56) References Cited

U.S. PATENT DOCUMENTS

| | | |
|---|---|---|
| 2009/0201477 A1 | 8/2009 | Butler |
| 2010/0167189 A1 | 7/2010 | Del Puerto |
| 2011/0222039 A1 | 9/2011 | Valentin et al. |
| 2015/0092171 A1 | 4/2015 | Butler |

OTHER PUBLICATIONS

International Preliminary Report on Patentability and Written Opinion of the International Searching Authority directed to related International Patent Application No. PCT/EP2013/069547, dated Apr. 28, 2015; 6 pages.

PATTERNING DEVICE MANIPULATING SYSTEM AND LITHOGRAPHIC APPARATUSES

CROSS-REFERENCE TO RELATED APPLICATIONS

This application claims the benefit of U.S. provisional application 61/717,208, which was filed on Oct. 23, 2012 and which is incorporated herein in its entirety by reference.

BACKGROUND

Field

Embodiments of the present invention generally relate to a positioning and shape modifying system for supporting an exchangeable object, and more particularly to a positioning and shape modifying system for a patterning device of a lithographic apparatus.

Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, for example, a mask or a reticle, may be used to generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The manufacture of ICs and other devices with a lithographic apparatus generally involves the replication of extremely fine sub-micron patterns. Accordingly, these patterns require accurately positioning and shaping the movable components of the lithographic apparatus, for example, a substrate or a patterning device.

SUMMARY

In some embodiments, a system for manipulating an exchangeable object can include a movable structure and an object holder that is movable relative to the movable structure. The object holder holds the exchangeable object. The system can also include a first actuator asse to the object holder to establish a desired shape of the exchangeable object.

In some embodiments, a lithographic apparatus can include a patterning device configured to i device holder that moves relative to the movable structure. The patterning device holder holds the patterning device. The system can also include a first actuator assembly and a second actuator assembly. The first actuator assembly applies a force to the patterning device holder to translate the patterning device generally along a plane. The second actuator assembly applies a bending moment to the patterning device holder to establish a desired shape of the object.

In some embodiments, a method of manipulating a patterning device of a lithographic apparatus includes applying a force to the patterning device to translate the patterning device generally along a plane. Applying the first force can compensate for an error between a desired position of a movable structure coupled to a patterning device holder that supports the patterning device and a measured position of the movable structure. The method of manipulating a patterning device can also include applying a bending moment to the patterning device to bend the patterning device. Applying the bending moment can compensate for an imaging or focus error.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
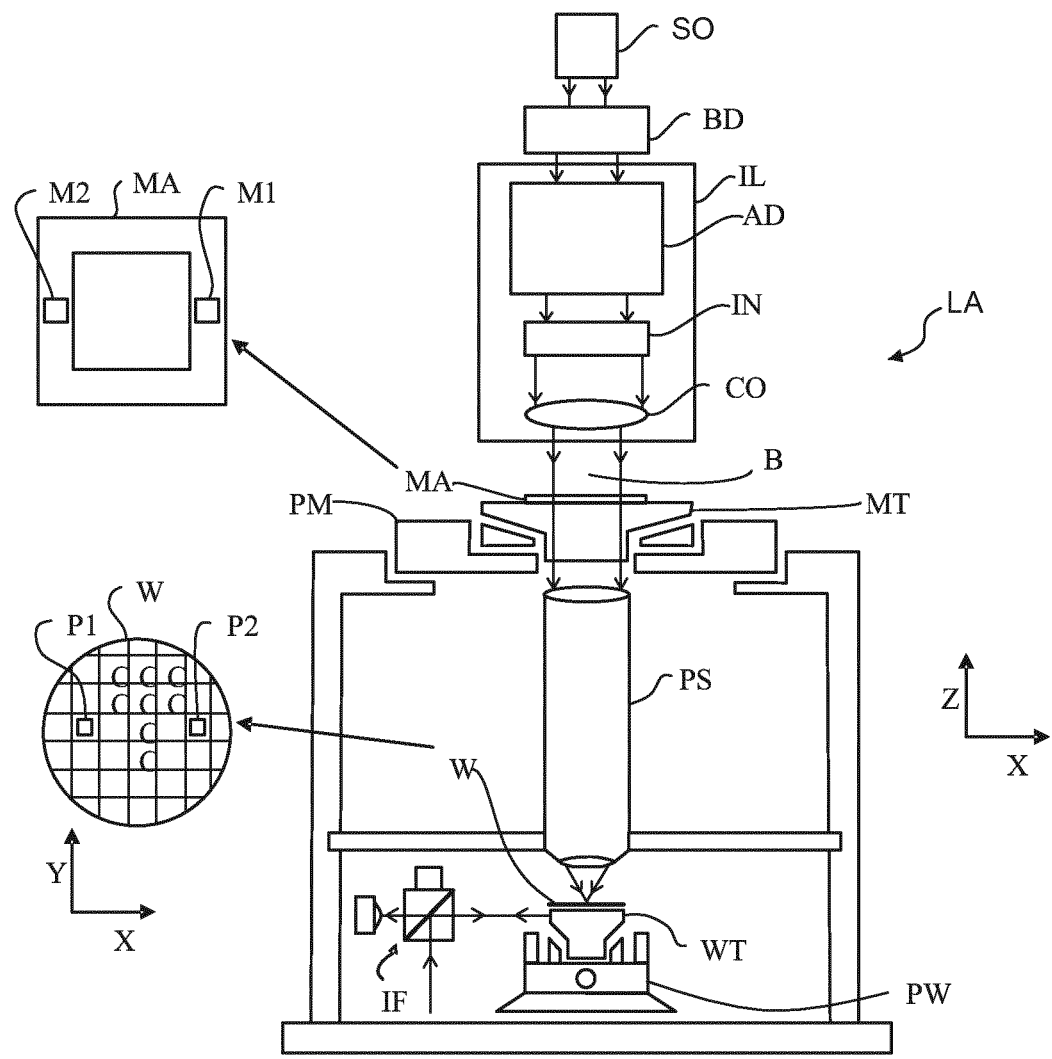
FIG. 1 schematically depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In some embodiments, a lithographic apparatus can include an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described below, the terms "lens" and "lens element," where the context allows, may refer to any one or combination of various types of optical components, comprising refractive, reflective, magnetic, electromagnetic and electrostatic optical components.

Also, in the embodiments described below, the terms "long stroke," "short stroke," and "ultra-short stroke" are used to indicate a relative difference between the distances of each stroke.

Further, the terms "radiation" and "beam" used herein encompass all types of electromagnetic radiation, comprising ultraviolet (UV) radiation (for example, having a wavelength λ of 365, 248, 193, 157 or 126 nm), extreme ultra-violet (EUV or soft X-ray) radiation (for example, having a wavelength in the range of 5-20 nm, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within the lithographic apparatus. It should be appreciated that radiation having a wavelength in the range of, for example, 5-20 nm relates to radiation with a certain wavelength band, of which at least part is in the range of 5-20 nm.

Before describing such embodiments in more detail, however, it is instructive to present an example environment in which embodiments of the present invention may be implemented.

FIG. 1 schematically depicts lithographic apparatus LA. Lithographic apparatus LA includes an illumination system (illuminator) IL configured to condition a radiation beam B (for example, DUV or EUV radiation); a patterning device support structure (for example, a mask table) MT configured to support a patterning device (for example, a mask, a reticle, or a dynamic patterning device) MA and connected to a first positioning system PM configured to accurately position or manipulate the support structure MT and the patterning device MA; and a substrate table (for example, a wafer table) WT configured to hold a substrate (for example, a resist coated wafer) W and connected to a second positioning system PW configured to accurately position the substrate table WT and the substrate W. Lithographic apparatus LA can also have a projection system PS configured to project a pattern imparted to the radiation beam B by patterning device MA onto a target portion (for example, comprising one or more dies) C of the substrate W. In lithographic apparatus LA, the patterning device MA and the projection system PS are transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus LA, and other conditions, for example, whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit. The patterning device MA may be transmissive (as in lithographic apparatus LA) or reflective (not shown). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus LA may be of a type having two (dual stage) or more substrate tables WT or two or more support structures MT. In such "multiple stage" machines, the additional substrate tables WT or support structures MT may be used in parallel, or preparatory steps may be carried out on one or more tables while one or more other substrate tables WT or support structures MT are being used for exposure.

The illuminator IL receives a radiation beam from a radiation source SO. The source SO and the lithographic apparatus LA may be separate entities, for example, when the source SO is an excimer laser. In such cases, the source SO is not considered to form part of the lithographic apparatus LA, and the radiation beam B passes from the source SO to the illuminator IL with the aid of a beam delivery system BD comprising, for example, suitable directing mirrors or a beam expander. In other cases, the source SO may be an integral part of the lithographic apparatus LA, for example, when the source SO is a mercury lamp. The source SO and the illuminator IL, together with the beam delivery system BD, if required, may be referred to as a radiation system.

The illuminator IL may comprise an adjuster AD for adjusting the angular intensity distribution of the radiation beam. Generally, at least the outer or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator IL may be used to condition the radiation beam B to have a desired uniformity and intensity distribution in its cross section.

The radiation beam B is incident on the patterning device (for example, a mask or reticle) MA, which is held on the support structure (for example, a mask table or wafer stage) WT, and is patterned by the patterning device MA. Having traversed the patterning device MA, the radiation beam B passes through the projection system PS, which focuses the beam onto a target portion C of the substrate W. With the aid of the second positioning system PW, which can include one or more force actuators (for example, servomechanisms or any other suitable force actuators) and one or more position sensors IF (for example, an interferometric device, linear encoder, capacitive sensor, or any other suitable position sensing device) in some embodiments, the substrate table WT and substrate W can be moved accurately, for example, so as to position different target portions C in the path of the radiation beam B. Similarly, the first positioning system PM, which can include one or more force actuators (for example, servomechanisms or any other suitable force actuator) and one or more position sensors (for example, an interferometric device, linear encoder, a capacitive sensor, or any other suitable position sensing device, and which are not shown in FIG. 1) in some embodiments, can be used to accurately position the support structure MT and patterning device MA with respect to the path of the radiation beam B, for example, after mechanical retrieval from a mask library, or during a scan.

Generally, movement of the support structure MT may be realized with the aid of a long-stroke component (coarse positioning) and a short-stroke component (fine positioning), which form part of the first positioning system PM. Similarly, movement of the substrate table WT may be realized using a long-stroke component and a short-stroke component, which form part of the second positioning system PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatus LA may be used in at least one of the following modes:

1. In step mode, the support structure (for example, mask table or wafer stage) MT and the substrate table WT are kept essentially stationary, while an entire pattern imparted to the radiation beam B is projected onto a target portion C at one time (i.e., a single static exposure). The substrate table WT is then shifted in the X or Y direction so that a different target portion C may be exposed.

2. In scan mode, the support structure MT and the substrate table WT are scanned synchronously while a pattern imparted to the radiation beam B is projected onto a target portion C (i.e., a single dynamic exposure). The velocity and direction of the substrate table WT relative to the support structure MT may be determined by the (de-)magnification and image reversal characteristics of the projection system PS.

3. In another mode, the support structure MT is kept generally stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations or variations on the described modes of use or entirely different modes of use may also be employed.

Figure 2:
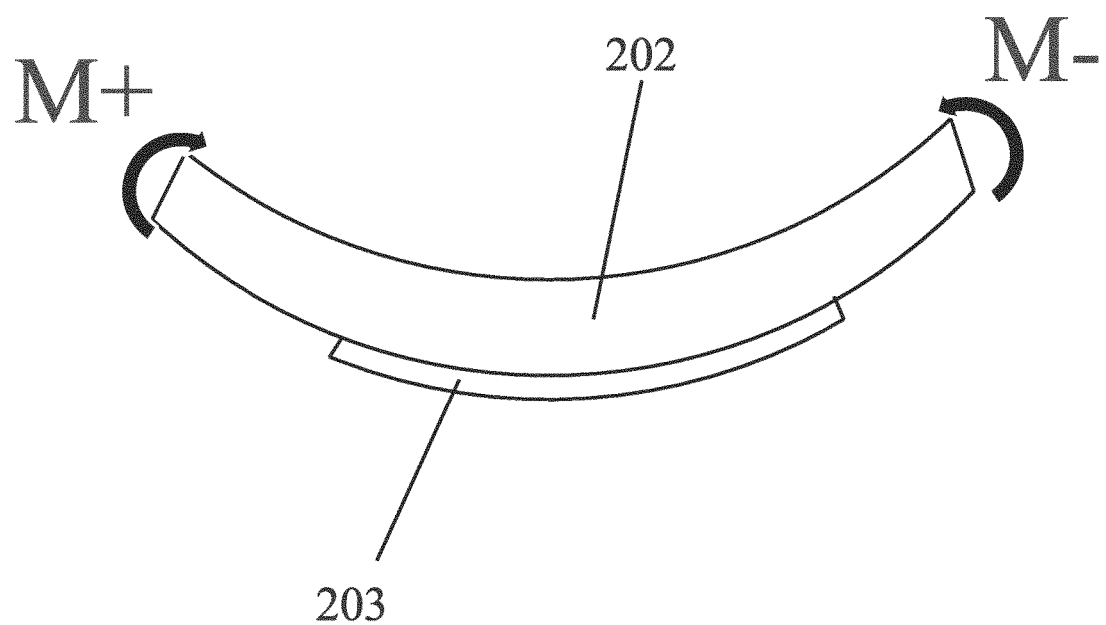
FIG. 2 depicts a schematic side view of an exchangeable object with applied bending moments according to an embodiment of the present invention.

In some embodiments, a system for supporting an exchangeable object can manipulate the shape of the exchangeable object by applying one or more bending moments to the exchangeable object. For example, FIG. 2 depicts a schematic side view of an exchangeable object 202 with applied bending moments according to an embodiment of the present invention. Exchangeable object 202 can be a patterning device, for example, a mask or a reticle, having a pattern 203. In such embodiments, patterning device 202 can be bent by applying one or more bending moments (M+ and M−) to patterning device 202 to improve focus and imaging, which allows a smaller line width and improved pattern definition. In some embodiments, the applied bending moments can provide a curvature correction at the projection location and can provide a local height and tilt correction. In some embodiments, the applied bending moments better match the projection of the pattern to the local curvature of a substrate.

In some embodiments, the bending moments are statically applied. For example, a desired bending moment may be determined before the substrate, for example, a die on the substrate, is scanned. The desired bending moment may then be constantly applied to patterning device 202 while the substrate is scanned.

In some embodiments, the bending moments are dynamically applied. For example, the applied bending moments may vary as the substrate is scanned to adapt the bending of the patterning device to the local curvature of the substrate and to correct lens heating defocus. Dynamic bending moment application may be beneficial when the surface of the substrate exhibits changes or irregularities that change during a scan or when the lens temperature may change during a scan.

In some embodiments, a scanning velocity is adjusted in accordance with the (static or dynamic) bending of patterning device 202.

Figure 3:
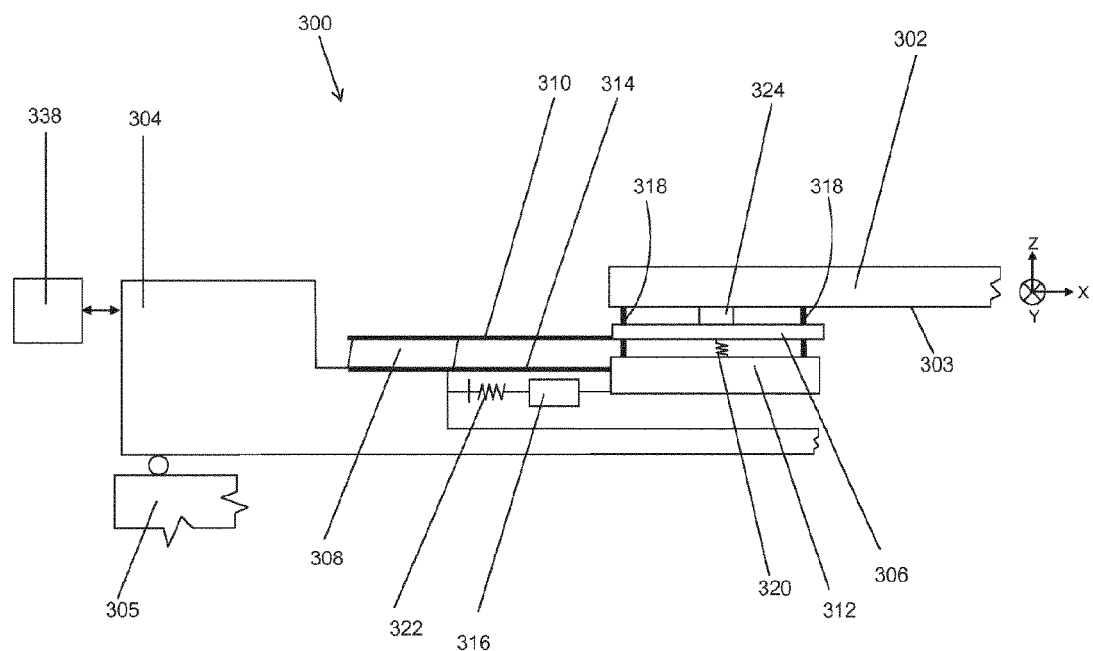
FIG. 3 depicts a schematic side view of a movable support according to an embodiment of the invention.

FIG. 3 depicts a schematic side view of a system 300 according to an embodiment of the invention. System 300 manipulates an exchangeable object 302 in a manner such that exchangeable object 302 can translate generally along a plane and such that exchangeable object 302 can be bent (or curved) out of the plane. For example, as illustrated in FIG. 3, exchangeable object 302 can translate along a plane defined by the x-axis and the y-axis (X-Y plane), and the curvature of exchangeable object 302 out of the X-Y plane can be adjusted.

In some embodiments, system 300 includes a lithographic apparatus's positioning system that supports a patterning device support, for example, a mask table or a reticle stage. In such embodiments, exchangeable object 302 is a patterning device, for example, a reticle or mask, having a pattern (not shown) disposed on a major surface 303.

As shown in FIG. 3, system 300 includes a first movable structure 304 that is movable relative to a second structure 305. In some embodiments, first movable structure 304 translates along a plane generally parallel to the plane in which exchangeable object 302 translates (for example, the X-Y plane). In some embodiments, second structure 305 is movable relative to a reference object, for example, a frame or balance mass (not shown). In some embodiments, second structure 305 translates along a plane generally parallel to the plane in which exchangeable object 302 translates (for example, the X-Y plane).

In some embodiments, first movable structure 304 is a short-stroke component, and second movable structure 305 is a long-stroke component. A long stroke actuator (not shown) moves second movable structure 305 with respect to the reference object. A short stroke actuator (not shown) moves first movable structure 304 with respect to second movable structure 305. Typically, the short stroke actuator positions first movable structure 304 relative to second movable structure 305 with a relatively high accuracy. The short stroke actuator has a limited working range. Typically, the long stroke actuator has a large working range, for example, the whole working space of system 300. The long stroke actuator positions second movable structure 305 with a relatively low accuracy. In operation, the long stroke actuator and second movable structure 305 move exchangeable object 302 to a position within a workable range of the short stroke actuator that includes a desired position of exchangeable object 302. Then the short stroke actuator and first movable structure 304 move exchangeable object 302 to the desired position.

First movable structure 304 and second movable structure 305 can have any suitable shape.

System 300 also includes an object holder 306. In some embodiments, object holder 306 is a patterning device support structure of a lithographic apparatus, for example, a mask table or reticle stage. Object holder 306 can be configured to selectively couple with exchangeable object 302. Object holder 306 can include a clamp. In some embodiments, as shown in FIG. 3, object holder 306 can be a W-clamp that includes a vacuum clamping area 324 that creates, for example, a leaking vacuum seal that couples exchangeable object 302 to object holder 306.

In some embodiments, object holder 306 is configured to be movable relative to first movable structure 304. For example, object holder 306 can be configured to translate along a plane that is generally parallel to the plane in which exchangeable object 302 translates (for example, the X-Y plane). In some embodiments, object holder 306 is configured to rotate relative to first movable structure 304. For example, object holder 306 can be configured to rotate about an axis that is generally parallel to the plane in which exchangeable object 302 translates (for example, the X-Y plane).

System 300 can also include a first actuator assembly (or shifter) configured to translate object holder 306 relative to first movable structure 304. For example, the first actuator assembly can be configured to translate object holder 306 along a plane that is generally parallel to the plane in which exchangeable object 302 translates (for example, the X-Y plane). The first actuator assembly is configured to apply one or more forces to object holder 306 to move object holder 306 and, in turn, exchangeable object 302, relative to first movable structure 304. In some embodiments, the forces applied to object holder 306 by the first actuator assembly are in a direction generally parallel to the plane in which exchangeable object 302 translates (for example, the X-Y plane).

The first actuator assembly can include one or more actuators 308 that generate a force to be applied to object holder 306. In some embodiments, actuator 308 can be an ultra-short stroke actuator. That is, the maximum stroke of actuator 308 is smaller than the maximum stroke of the short stroke actuator (not shown) that moves first movable structure 304 relative to second movable structure 305. And in some embodiments, the accuracy of actuator 308 is higher than the accuracy of the short stroke actuator. As shown in FIG. 3, actuator 308 is coupled to a surface of first movable structure 304.

In some embodiments, actuator 308 is a piezoelectric actuator that deforms based on an applied electric voltage or charge. In some embodiments, actuator 308 can be a stack or shear piezoelectric actuator. For example, as shown in FIG. 3, actuator 308 is a shear piezoelectric actuator.

Notably, although FIG. 3 depicts only one actuator 308, system 300 can include more than one actuator 308. In such multiple actuator embodiments, actuators 308 can be spaced around a periphery of exchangeable object 302. For example, the first actuator assembly can include at least one first actuator 308 and at least one second actuator 308 (not shown) that can be configured to move exchangeable object 302 along first and second axes (for example, the X-axis and the Y-axis) of a coordinate system in the plane (for example, the X-Y plane), respectively.

The first actuator assembly can also include a connecting structure 310 that couples actuator 308 to object holder 306. For example, as shown in FIG. 3, a first end of connecting structure 310 is coupled to the distal portion of actuator 308 that is not coupled to movable structure 304, and the second end of connecting structure 310 is coupled to object holder 306. In some embodiments, connecting structure 310 lies within a plane generally parallel to the plane in which exchangeable object 302 translates (for example, the X-Y plane). Connecting structure 310 can be generally rigid in a plane generally parallel to the plane in which exchangeable object 302 translates (for example, the X-Y plane), and can be generally compliant in a direction perpendicular to the plane in which exchangeable object 302 translates. For example, during operation, the force component generated by actuator 308 that is in a plane generally parallel to the plane in which exchangeable object 302 translates is transferred to object holder 306 via connecting structure 310. This force application helps translate object holder 306 along a plane generally parallel to the plane in which exchangeable object 302 translates (for example, the X-Y plane). Accordingly, the first actuator assembly can provide in-plane rigid body shifting of exchangeable object 302.

In some embodiments, connecting structure 310 is a leaf spring.

Notably, although FIG. 3 depicts only one connecting structure 310, system 300 can include more than one connecting structure 310.

System 300 can also include a second actuator assembly (or bender) configured to adapt the curvature of exchangeable object 302 out of the plane in which exchangeable object 302 translates by applying one or more bending moments to intermediate structure 312 and, in turn, exchangeable object 302. For example, the second actuator assembly can be configured to generate a bending moment, for example, a bending moment about an axis (for example, the Y-axis) that is parallel to the plane in which exchangeable object 302 translates (for example, the X-Y plane).

In some embodiments, the first and second actuator assemblies (the bender and shifter) are part of a monolithic assembly. That is, the first and second actuator assemblies are integrated with one another to form the monolithic assembly. For example, in one embodiment, intermediate structure 312 links the first actuator assembly to the second actuator assembly in such a way that both can function either independently or simultaneously to provide their intended functionality.

As shown in FIG. 3, the second actuator assembly can include an actuator 316 and an intermediate structure 312. Actuator 316 and intermediate structure 312 are configured such that a force generated by actuator 316 generates a bending moment that is applied to intermediate structure 312, which causes intermediate structure 312 to rotate relative to first movable structure 304. In some embodiments, actuator 316 is configured to generate a force in a direction generally parallel to the plane in which exchangeable object 302 translates (for example, the X-Y plane). In some embodiments, intermediate structure 312 can be positioned on a side of object holder 306 that is opposite from exchangeable object 302.

Notably, although FIG. 3 depicts only one actuator 316, the second actuator assembly can include more than one actuator 316 in some embodiments. In such multiple actuator embodiments, actuators 316 can be spaced around a periphery of exchangeable object 302. For example, in some embodiments, one or more actuators 308 and one or more actuators 316 are positioned on one side of object 302 to apply a first moment to object 302, and one or more actuators 308 and one or more actuators 316 are positioned on the opposite side of object 302 (not shown in FIG. 3) to apply a second moment. In such embodiments, the second bending moment can be in a direction opposite of the direction of the first bending moment.

In some embodiments, actuator 316 is a piezoelectric actuator that deforms based on an applied electric voltage or charge. In some embodiments, actuator 316 is a stack or shear piezoelectric actuator. As shown in FIG. 3, actuator 316 is a stack piezoelectric actuator.

The second actuator assembly can also include a connecting structure 314 that couples intermediate structure 312 to first movable structure 304. For example, as shown in FIG. 3, a first end of connecting structure 314 is coupled to intermediate structure 312, and a second end of connecting structure 314 is coupled to first movable structure 304. In some embodiments, connecting structure 314 lies within a plane generally parallel to the plane in which exchangeable object 302 translates (for example, the X-Y plane). In some embodiments, connecting structure 314 is generally rigid in a plane generally parallel to the plane in which exchangeable object 302 translates (for example, the X-Y plane), and generally compliant in a direction generally perpendicular to X-Y plane (the Z direction).

In some embodiments, connecting structure 314 is a leaf spring.

Notably, although FIG. 3 depicts only one connecting structure 314, the second actuator assembly can include more than one connecting structure 314.

In some embodiments, the point at which actuator 316 is coupled to intermediate structure 312 is offset from the point at which connecting structure 314 is coupled to intermediate structure 312. This offset generates a bending moment when actuator 316 generates a force because intermediate structure 312 pivots approximately about the point at which connecting structure 314 is coupled to intermediate structure 312. The bending moment may be positive or negative based on the polarity of operation of actuator 316.

In some embodiments, as shown in FIG. 3, an elastic member 322 can be positioned in series between actuator 316 and first movable structure 304. In some embodiments, elastic member 322 is a spring. Elastic member 322 can generate a force based on the expansion of actuator 316. That is, elastic member 322 approximately converts a position actuator into a force actuator. Elastic member 322 can provide compliance to system 300 such that greater resolution of force application can be achieved based on a given input to actuator 316, relative to an embodiment without such an elastic member. In some embodiments, elastic member 322 provides rotational compliance of intermediate structure 312 to allow shape adaptation of object 302.

In some embodiments, intermediate structure 312 is coupled to object holder 306 in a manner such that the bending moment applied to intermediate structure 312 is transferred to object holder 306 and, in turn, exchangeable object 302. This bending moment causes exchangeable object 302 to bend out of the plane in which exchangeable object 302 translates.

In some embodiments, intermediate structure 312 is coupled to exchangeable object 302 in a manner such that the bending moment applied to intermediate structure 312 is transferred to exchangeable object 302. This bending moment causes exchangeable object 302 to bend out of the plane in which exchangeable object 302 translates.

In some embodiments, the second actuator assembly is configured to bend exchangeable object 302 approximately about its neutral axis such that the bending stresses across the thickness of exchangeable object 302 are approximately symmetric. In embodiments in which exchangeable object 302 is a patterning device, such an approximately symmetric stress-distribution does not cause a substantial net stress-birefringence change to occur in the radiation beam that passes through the patterning device. In some embodiments, the net stress-birefringence level is equal to or less than about 5 nm/cm.

In some embodiments, the second actuator assembly includes a plurality of pins 318 coupled to intermediate structure 312. For example, as shown in FIG. 3, two pins 318 are coupled to intermediate structure 312. Pins 318 are arranged to contact exchangeable object 302. In some embodiments, pins 318 are generally compliant in a plane parallel to the plane in which exchangeable object 302 translates (for example, the X-Y plane). This compliance allows pins 318 to follow any dimensional changes to surface 303 of exchangeable object 302 in a plane that is generally parallel to the plane in which exchangeable object 302 translates. For example, surface 303 can lengthen or shorten when a bending moment is applied to exchangeable object 302.

In some embodiments, pins 318 are generally rigid in a direction (for example, the Z direction) that is generally perpendicular to the plane in which exchangeable object 302 translates (for example, the X-Y plane). Accordingly, the bending moment applied to intermediate structure 312 by operation of actuator 316 is transferred to exchangeable object 302 through pins 318.

In some embodiments, object holder 306 defines respective channels for closely receiving pins 318. In some embodiments, object holder 306 can translate relative to pins 318 and intermediate structure 312. In some embodiments in which object holder 306 translates relative to pins 318, system 300 can include a second elastic member 320. In some embodiments, elastic member 320 is a spring. Elastic member 320 is coupled to intermediate structure 312 and to object holder 306. Elastic member 320 can be a tension spring configured to bias object holder 306 towards intermediate structure 312. This bias preloads exchangeable object 302 against pins 318 when object holder 306 is coupled with exchangeable object 302. In some embodiments, elastic member 320 is compliant in the plane in which exchangeable object 302 translates (for example, the X-Y plane) such that object holder 306 or exchangeable object 302 can move in-plane independently from the second actuator assembly.

In some embodiments, pins 318 are each monolithic. In some embodiments, pins 318 are collectively formed by two discrete portions. In such embodiments, a first discrete portion of pin 318 runs between intermediate structure 312 and object holder 306, and a second discrete portion of pin 318 runs between object holder 306 and exchangeable object 302.

One or more controllers 338 can control actuator 308 and actuator 316. Controller 338 can be, for example, any suitable programmed microprocessor, microcontroller, or any other suitable analogue or digital control device.

In some embodiments, controller 338 controls actuator 316 to either statically or dynamically change the bending moment(s) applied to exchangeable object 302 to achieve a desired curvature. In some embodiments, the resulting deformation of object 302 is elastic. For embodiments in which exchangeable object 302 is a patterning device, such curvature control can improve machine focus by resolving defocus contributions caused by wafer unevenness and by lens heating. For example, controller 338 can receive leveling information, for example, a leveling map, obtained from a leveling measurement, and from this information, controller 338 can determine a desired bending moment to apply to exchangeable object 302. Controller 338 then controls the actuation of actuator 316 to apply the desired bending moment to exchangeable object 302 to resolve any defocus contributions caused by wafer unevenness.

In some embodiments, controller 338 controls actuator 308 to either statically or dynamically translate exchangeable object 202 substantially along a plane, for example, the X-Y plane, to a desired position. In some embodiments in which system 300 supports a patterning device support structure, for example, a reticle stage, this translation of exchangeable object 302 can compensate for positioning errors of a substrate support structure, for example, a wafer stage. In some embodiments, this translation of exchangeable object 302 can compensate for positioning errors of first movable structure 304, positioning errors of second movable structure 305, or positioning errors of exchangeable object 302 (for example, positioning errors caused by motion attributable to the compliance of connecting structure 310).

In some embodiments, controller 338 can be configured to synchronize the actuation of actuator 308 and actuator 316 in a manner that slippage of the interface between surface 303 of exchangeable object 302 and object holder 306 or undesired stress in object 302 is generally prevented or at least minimized. For example, when a bending moment is applied to exchangeable object 302, surface 303 of exchangeable object 302 expands under tension or contracts under compression. Such dimensional changes of surface 303 can cause the interface between exchangeable object 302 and object holder 306 to slip and can generate a stress in object 302 that causes an unwanted deformation in object 302. This slippage or stress can lead to position uncertainty of exchangeable object 302. For example, if exchangeable object 302 is a patterning device, the slippage or stress can lead to overlay errors. To generally prevent this slippage or stress, for example, controller 338 can control actuator 308 and, in turn, object holder 306, such that in-plane displacement of object holder 306 generally tracks the in-plane dimensional changes of surface 303 of exchangeable object 302 when a bending moment is applied to exchangeable object 302. In such embodiments, generally rigid coupling between exchangeable object 302 and first movable structure 304 can be maintained.

In some embodiments in which exchangeable object 302 is a patterning device of a lithographic apparatus, controller 338 can be configured to control an adjustable optical element of a projection system. For example, controller 338 can control the adjustable optical element of the projection system to at least partly compensate for the pattern deformation that may result from applying a bending moment to the patterning device. In some embodiments, controller 338 can control positions of a support structure MT or the substrate table WT of a lithographic apparatus.

In some embodiments, system 300 can include one or more sensors (not shown) to measure a position of actuator 316 or a force generated by actuator 316. For example, system 300 can include a strain gauge coupled to actuator 316 to determine the position of actuator 316. In some embodiments, controller 338 can use the sensed position or force of actuator 316, for example, to control the applied bending moments.

Figure 4:
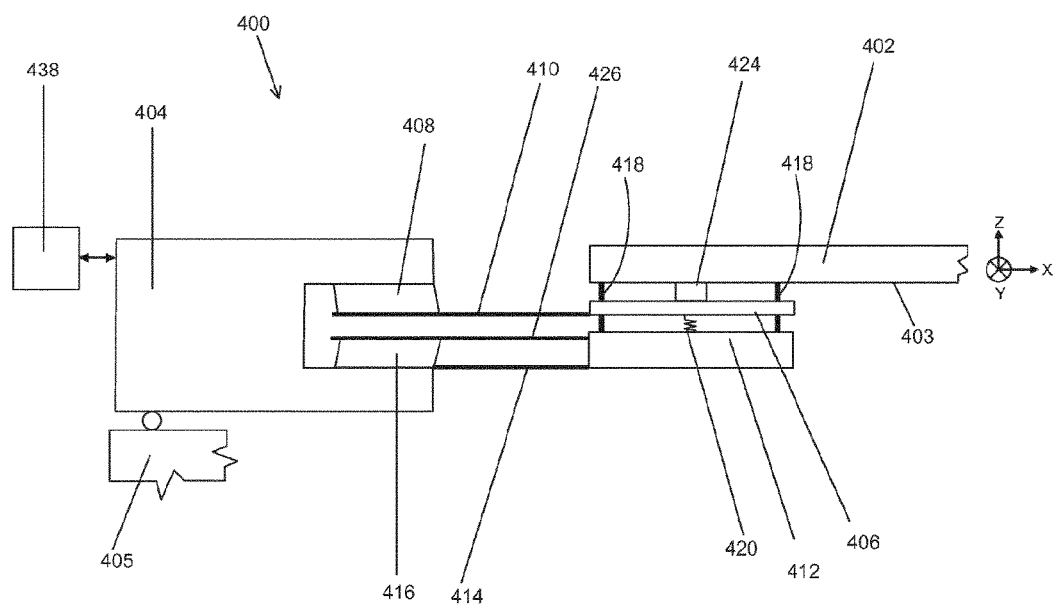
FIG. 4 depicts a schematic side view of a movable support according to another embodiment of the invention.

FIG. 4 depicts a schematic side view of a system 400 according to another embodiment of the invention. System 400 manipulates an exchangeable object 402 in a manner such that exchangeable object 402 can translate generally along a plane and such that exchangeable object 402 can be bent out of the plane in which it translates. For example, as illustrated in FIG. 4, exchangeable object 402 can translate along a plane defined by the x-axis and the y-axis (X-Y plane), and the curvature of exchangeable object 302 out of the X-Y plane can be adjusted.

In some embodiments, system 400 includes a lithographic apparatus's positioning system that supports and positions a patterning device support, for example, a mask table or a reticle stage. In some embodiments, exchangeable object 402 is a patterning device, for example, a reticle or mask, positioned on the patterning device support. In such embodiments, exchangeable object 402 can have a pattern (not shown) disposed on a major surface 403.

System 400 includes similar features as the above described system 300. These similar features are similarly numbered and function generally the same as they do in system 300.

For example, system 400 includes a first movable structure 404 that is movable relative to a second structure 405, and second structure 405 is movable relative to a reference object (not shown). In some embodiments, first movable structure 404 is a short-stroke component, and second movable structure 405 is a long-stroke component.

System 400 also includes an object holder 406. In some embodiments, object holder 406 is a patterning device support structure of a lithographic apparatus, for example, a mask table or reticle stage. Object holder 406 can be configured to selectively couple with exchangeable object 402. Object holder 406 is configured to be movable relative to first movable structure 404. In some embodiments, object holder 406 is configured to translate along a plane that is generally parallel to the plane in which exchangeable object 402 translates (for example, the X-Y plane). In some embodiments, object holder 406 is configured to rotate about an axis generally parallel to the plane in which exchangeable object 402 translates (for example, the X-Y plane).

System 400 also includes a first actuator assembly configured to move object holder 406 relative to first movable structure 404. For example, the first actuator assembly can be configured to translate object holder 406 along a plane that is generally parallel to the plane in which exchangeable object 402 translates (for example, the X-Y plane). The first actuator assembly is configured to apply one or more forces to object holder 406 to move object holder 406 and, in turn, exchangeable object 402, relative to first movable structure 404. In some embodiments, the forces applied to object holder 406 by the first actuator assembly translates exchangeable object 402 along a plane (for example, the X-Y plane).

The first actuator assembly can include one or more actuators 408 that generate a force to be applied to object holder 406. In some embodiments, actuator 408 can be an ultra-short stroke actuator. As shown in FIG. 4, actuator 408 is coupled to a surface of first movable structure 404. In some embodiments, actuator 408 is a piezoelectric actuator that deforms based on an applied electric voltage or charge. In some embodiments, actuator 408 is stack or shear piezoelectric actuators. For example, as shown in FIG. 4, actuator 408 is a shear piezoelectric actuator. Notably, although FIG. 4 depicts only one actuator 408, system 400 can include more than one actuator 408.

The first actuator assembly can also include a connecting structure 410 that couples actuator 408 to object holder 406. Connecting structure 410 can be configured to be generally rigid in a plane generally parallel to the plane in which exchangeable object 402 translates (for example, the X-Y plane), and configured to be generally compliant in a direction generally perpendicular to the X-Y plane. For example, during operation, the force component generated by actuator 408 that is in a plane generally parallel to the plane in which exchangeable object 402 translates is transferred to object holder 406 via connecting structure 410. This force application translates object holder 406 along a plane generally parallel to the X-Y plane. Accordingly, the first actuator assembly provides in-plane rigid body shifting of exchangeable object 402. In some embodiments, connecting structure 410 is a leaf spring. Notably, although FIG. 4 depicts only one connecting structure 410, system 400 can include more than one connecting structure 410.

System 400 can also include a second actuator assembly configured to adapt the curvature of exchangeable object 402 out of the plane in which exchangeable object 402 translates by applying one or more bending moments to object holder 406 and, in turn, exchangeable object 402. For example, the second actuator assembly can be configured to generate a bending moment about an axis that is generally parallel to the plane in which exchangeable object 402 translates.

As shown in FIG. 4, the second actuator assembly includes an actuator 416 and an intermediate structure 412. Actuator 416 and intermediate structure 412 are configured such that a force generated by actuator 416 applies a bending moment to intermediate structure 412, which causes intermediate structure 412 to rotate relative to first movable structure 404. In some embodiments, actuator 416 is configured to generate a force in a direction generally parallel to the plane in which exchangeable object 402 translates. In some embodiments, intermediate structure 412 can be positioned on a side of object holder 406 that is opposite from exchangeable object 402. Notably, although FIG. 4 depicts only one actuator 416, the second actuator assembly can include more than one actuator 416. In such multiple actuator embodiments, actuators 416 can be spaced around a periphery of exchangeable object 402.

In some embodiments, actuator 416 is a piezoelectric actuator that deforms based on an applied electric voltage or charge. In some embodiments, actuator 416 is a stack or shear piezoelectric actuator. As shown in FIG. 4, actuator 416 is a shear piezoelectric actuator.

The second actuator assembly can also include a first connecting structure 426 that couples actuator 416 to intermediate structure 412. For example, as shown in FIG. 4, a first end of connecting structure 426 is coupled to the distal portion of actuator 416 opposite from the portion coupled to first movable structure 404 that deforms, and the second end of connecting structure 426 is coupled to intermediate structure 412. In some embodiments, connecting structure 426 lies within a plane generally parallel to the plane in which exchangeable object 402 translates (for example, the X-Y plane). In some embodiments, connecting structure 426 is configured to be generally rigid in a plane generally parallel to the plane in which the exchangeable object 402 translates (for example, the X-Y plane), and configured to be generally compliant in a direction generally perpendicular to the X-Y plane. For example, during operation, the force component generated by actuator 416 parallel to the X-Y plane is transferred to intermediate structure 412 via connecting structure 426. The second actuator assembly can also include a connecting structure 414 that couples intermediate structure 412 to first movable structure 404 or a non-deforming portion of actuator 416. For example, as shown in FIG. 4, a first end of connecting structure 414 is coupled to intermediate structure 412, and a second end of connecting structure 414 is coupled to first movable structure 404. In some embodiments, connecting structure 414 lies within a plane generally parallel to the X-Y plane in which exchangeable object 402 translates. In some embodiments, connecting structure 414 is configured to be generally rigid in a plane generally parallel to the plane in which exchangeable object 402 translates, and configured to be generally compliant in a direction generally perpendicular to the plane in which exchangeable object 402 translates.

In some embodiments, connecting structures 414 and 426 are leaf springs.

Notably, although FIG. 4 depicts only one connecting structure 414 and one connecting structure 426, the second actuator assembly can include more than one connecting structure 414 and more than one connecting structure 426.

In some embodiments, the point at which connecting structure 426 is coupled to intermediate structure 412 is offset from the point at which connecting structure 414 is coupled to intermediate structure 412. This offset generates a bending moment when actuator 416 generates a force, and intermediate structure 412 pivots approximately about the point at which connecting structure 414 is coupled to intermediate structure 412. The bending moment may be positive or negative based on the polarity of operation of actuator 416.

Intermediate structure 412 is coupled to object holder 406 in a manner such that the bending moment applied to intermediate structure 412 is transferred to object holder 406 and, in turn, exchangeable object 402, which causes exchangeable object 402 to bend.

In some embodiments, the second actuator assembly is configured to bend exchangeable object 402 approximately about its neutral axis such that the bending stresses across the thickness of exchangeable object 402 are approximately symmetric. In embodiments in which exchangeable object 402 is a patterning device, such an approximately symmetric stress-distribution will not cause a substantial net stress-birefringence change to occur in the radiation beam that passes through the patterning device. In some embodiments, the net stress-birefringence level is equal to or less than about 5 nm/cm.

In some embodiments, second actuator assembly includes a plurality of pins 418 coupled to intermediate structure 412. For example, as shown in FIG. 4, two pins 418 are coupled to intermediate structure 412. Pins 418 are arranged to contact exchangeable object 402. In some embodiments, pins 418 are generally compliant in a plane generally parallel to the plane in which exchangeable object 402 translates (for example, the X-Y plane), and pins 418 are generally rigid in a direction that is generally perpendicular to the plane in which exchangeable object 402 translates (for example, the X-Y plane). Accordingly, the bending moment applied to intermediate structure 412 by operation of actuator 416 is transferred to exchangeable object 402 through pins 418.

In some embodiments, object holder 406 defines respective channels for closely receiving pins 418. In some embodiments, object holder 406 can translate relative to pins 418. In some embodiments in which object holder 406 translates relative to pins 418, the second actuator assembly can include an elastic member 420. Elastic member 420 is coupled to intermediate structure 412 and to object holder 406. In some embodiments, elastic member 420 is a spring. Elastic member 420 can be a tension spring configured to bias object holder 406 towards intermediate structure 412. This bias preloads exchangeable object 402 against pins 418 when object holder 406 is coupled with exchangeable object 402.

In some embodiments, pins 418 are each monolithic. In some embodiments, pins 418 are collectively formed by two discrete portions. In such embodiments, a first discrete portion of pin 418 runs between intermediate structure 412 and object holder 406, and a second discrete portion of pin 418 runs between object holder 406 and exchangeable object 402.

A controller 438 can control actuator 408 and actuator 416. Controller 438 can be, for example, any suitable programmed microprocessor, microcontroller, or any other suitable analogue or digital control device. In some embodiments, controller 438 controls actuator 408 and actuator 416 as described above with reference to controller 338. In some embodiments, controller 438 controls an adjustable optical element of a projection system as described above with reference to controller 338.

Figure 5:
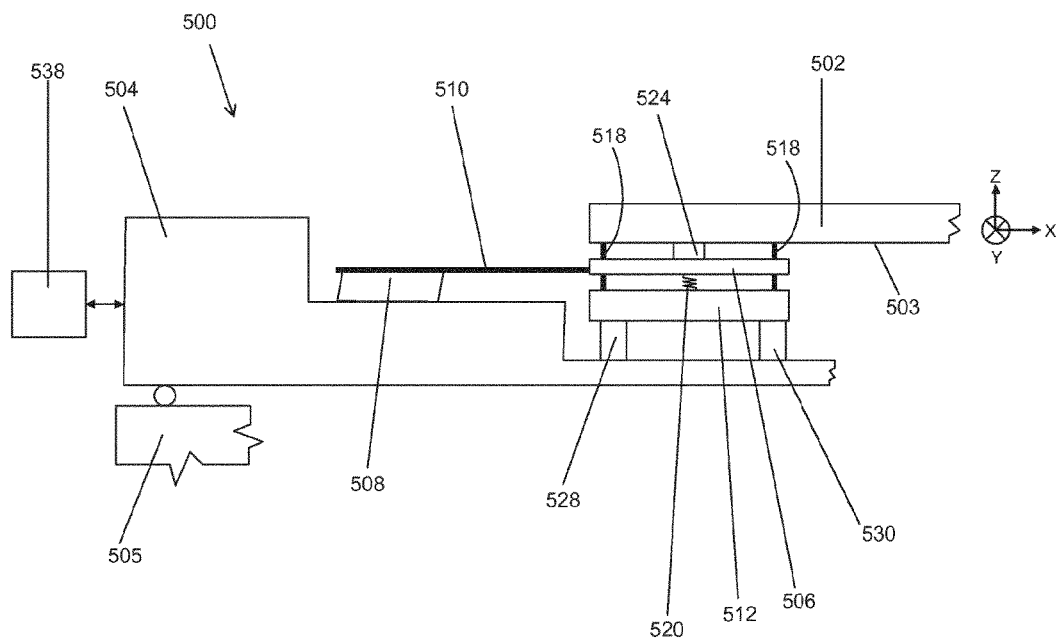
FIG. 5 depicts a schematic side view of a movable support according to another embodiment of the invention.

FIG. 5 depicts a schematic side view of a system 500 according to another embodiment of the invention. System 500 supports and positions an exchangeable object 502 in a manner such that exchangeable object 502 can be translated along a plane and such that the out-of-plane curvature of exchangeable object 502 can be adjusted. For example, as illustrated in FIG. 5, exchangeable object 502 can translate along a plane defined by the x-axis and the y-axis (X-Y plane), and the curvature of exchangeable object 502 out of the X-Y plane can be adjusted. System 500 includes similar features as the above described systems 300 and 400. These similar features are similarly numbered and function generally the same as they do in systems 300 and 400.

For example, system 500 includes a first movable structure 504 that is movable relative to a second structure 505, and second structure 505 is movable relative to a reference object (not shown). In some embodiments, first movable structure 504 is a short-stroke component, and second movable structure 505 is a long-stroke component.

System 500 also includes an object holder 506. Object holder 506 can be configured to selectively couple with exchangeable object 502. Object holder 506 is configured to be movable relative to first movable structure 504. In some embodiments, object holder 506 is a patterning device support structure of a lithographic apparatus, for example, a mask table or reticle stage. In some embodiments, object holder 506 is configured to translate along a plane that is parallel to the X-Y plane in which exchangeable object 502 translates. In some embodiments, object holder 506 is configured to rotate approximately about an axis generally parallel to the X-Y plane.

System 500 also includes a first actuator assembly configured to move object holder 506 relative to first movable structure 504. For example, the first actuator assembly can be configured to translate object holder 506 along a plane that is generally parallel to the plane in which exchangeable object 502 translates (for example, the X-Y plane). The first actuator assembly is configured to apply one or more forces to object holder 506 to move object holder 506 and, in turn, exchangeable object 502, relative to first movable object 504. In some embodiments, the forces applied to object holder 506 by the first actuator assembly are in a direction generally parallel to the plane in which exchangeable object 502 translates (for example, the X-Y plane).

The first actuator assembly includes one or more actuators 508 that generate a force to be applied to object holder 506. In some embodiments, actuator 508 can be an ultra-short stroke actuator. As shown in FIG. 5, actuator 508 is coupled to a surface of first movable structure 504. In some embodiments, actuator 508 is a piezoelectric actuator that deforms based on an applied electric voltage or charge. In some embodiments, actuator 508 is stack or shear piezoelectric actuators. For example, as shown in FIG. 5, actuator 508 is a shear piezoelectric actuator. Notably, although FIG. 5 depicts only one actuator 508, system 500 can include more than one actuator 508.

The first actuator assembly can also include a connecting structure 510 that couples actuator 508 to object holder 506. Connecting structure 510 can be generally rigid in a plane generally parallel to the plane in which exchangeable object 502 translates (for example, the X-Y plane), and generally compliant in a direction generally perpendicular to the X-Y plane. For example, during operation, the force generated by actuator 508 is transferred to object holder 506 via connecting structure 510. This force application translates object holder 506 along a plane generally parallel to the plane in which exchangeable object 502 translates. In some embodiments, connecting structure 510 is a leaf spring. Notably, although FIG. 5 depicts only one connecting structure 510, system 500 can include more than one connecting structure 510.

System 500 can also include a second actuator assembly configured to adapt the curvature of exchangeable object 502 out of the plane in which exchangeable object 502 translates by applying one or more bending moments to exchangeable object 502. For example, the second actuator assembly can be configured to generate a bending moment approximately about an axis that is generally parallel to the plane in which exchangeable object 502 translates.

As shown in FIG. 5, the second actuator assembly includes a first actuator 528, a second actuator 530, and an intermediate structure 512. First and second actuators 528 and 530 are each coupled to movable structure 504 on one end and to intermediate structure 512 on the other end. In some embodiments, first and second actuators 528 and 530 are each configured to apply a force in a direction that is generally perpendicular to the plane (for example, the X-Y plane) in which expandable object 502 translates. The variation between the forces applied by first and second actuators 528 and 530 can generate a bending moment that is transferred to intermediate structure 512. This bending moment causes intermediate structure 512 to rotate relative to first movable structure 504. The bending moment may be positive or negative based on the polarity of operation of actuators 528 and 530. In some embodiments, intermediate structure 512 can be positioned on a side of object holder 506 that is opposite from exchangeable object 502.

Notably, although FIG. 5 depicts only one actuator 528 and one actuator 530, the second actuator assembly can include more than one actuator 528 and more than one actuator 530. In such multiple actuator embodiments, actuators 528 and 530 can be spaced around a periphery of exchangeable object 502.

In some embodiments, actuators 528 and 530 are piezoelectric actuators that deform based on applied electric voltages or charges. In some embodiments, actuators 528 and 530 are stack or shear piezoelectric actuator. As shown in FIG. 5, actuators 528 and 530 are stack piezoelectric actuators.

Intermediate structure 512 is coupled to object holder 506 in a manner such that the bending moment applied to intermediate structure 512 is transferred to object holder 506 and, in turn, exchangeable object 502, which causes exchangeable object 502 to bend.

In some embodiments, the second actuator assembly is configured to bend exchangeable object 502 approximately about its neutral axis such that the bending stresses across the thickness of exchangeable object 502 are approximately symmetric. In embodiments in which exchangeable object 502 is a patterning device, such an approximately symmetric stress-distribution will not cause a substantial net stress-birefringence change to occur in the radiation beam that passes through the patterning device. In some embodiments, the net stress-birefringence level is equal to or less than about 5 nm/cm.

In some embodiments, second actuator assembly includes a plurality of pins 518 coupled to intermediate structure 512. For example, as shown in FIG. 5, two pins 518 are coupled to intermediate structure 512. Pins 518 are arranged to contact exchangeable object 502. In some embodiments, pins 518 are generally compliant in a plane generally parallel to plane in which exchangeable object 502 translates, and pins 518 are generally rigid in a direction that is generally perpendicular to the X-Y plane. Accordingly, the bending moment applied to intermediate structure 512 by operation of actuator 516 is transferred to exchangeable object 502 through pins 518.

In some embodiments, object holder 506 defines respective channels for closely receiving pins 518. In some embodiments, object holder 506 can translate relative to pins 518. In some embodiments in which object holder 506 translates relative to pins 518, the second actuator assembly can include an elastic member 520. Elastic member 520 is coupled to intermediate structure 512 and to object holder 506. In some embodiments, elastic member 520 can be a spring. Elastic member 520 can be a tension spring configured to bias object holder 506 towards intermediate structure 512. This bias preloads exchangeable object 502 against pins 518 when object holder 506 is coupled with exchangeable object 502. In some embodiments, pins 518 are each monolithic. In some embodiments, pins 518 are collectively formed by two discrete portions. In such embodiments, a first discrete portion of pin 518 runs between intermediate structure 512 and object holder 506, and a second discrete portion of pin 518 runs between object holder 506 and exchangeable object 502.

A controller 538 can control actuator 508 and actuators 528 and 530. Controller 538 can be, for example, any suitable programmed microprocessor, microcontroller, or any other suitable analogue or digital control device. In some embodiments, controller 538 controls actuator 508 and actuators 528 and 530 as described above with reference to controllers 338 and 438. In some embodiments, controller 538 controls an adjustable optical element of a projection system as described above with reference to controllers 338 and 438.

Figure 6:
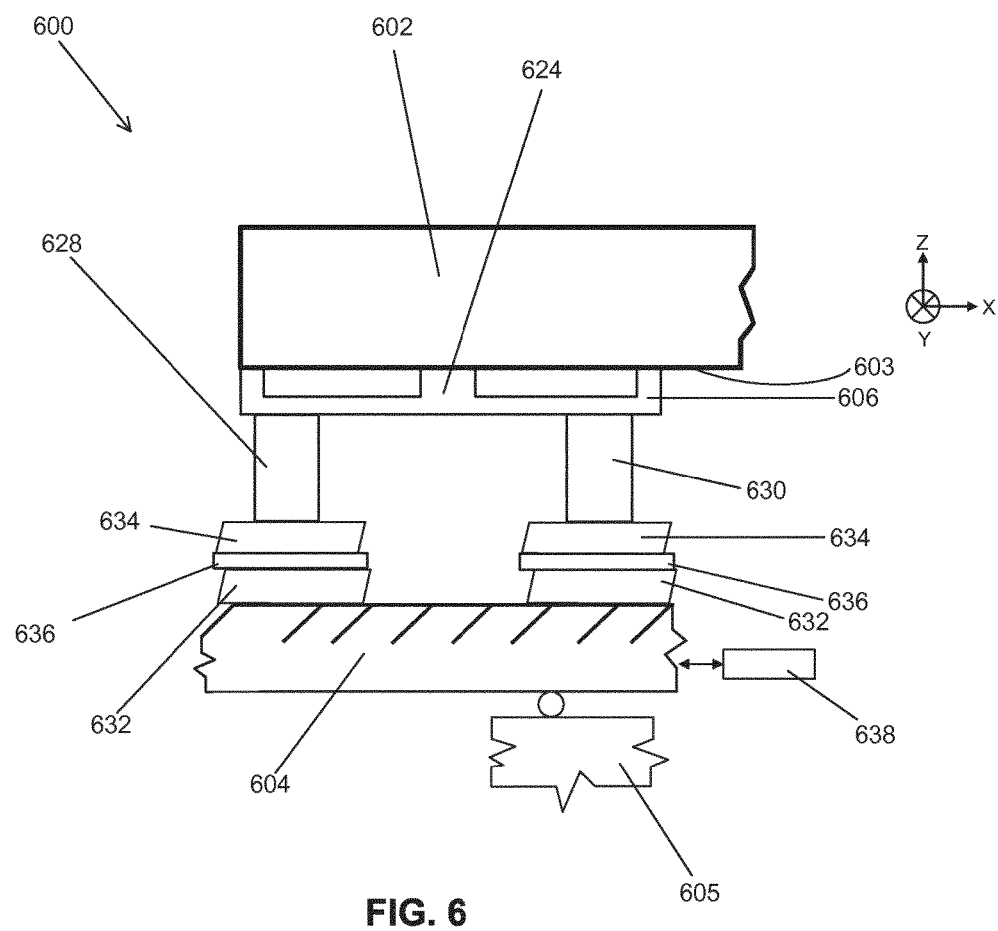
FIG. 6 depicts a schematic side view of a movable support according to another embodiment of the invention.

FIG. 6 depicts a schematic side view of a system 600 according to another embodiment of the invention. System 600 supports and positions an exchangeable object 602 in a manner such that exchangeable object 602 can be translated along a plane and such that the out-of-plane curvature of exchangeable object 602 can be adjusted. For example, as illustrated in FIG. 6, exchangeable object 602 can translate along a plane defined by the x-axis and the y-axis (X-Y plane), and the curvature of exchangeable object 602 out of the X-Y plane can be adjusted. System 600 includes similar features as the above described systems 300, 400, and 500. These similar features are similarly numbered and function generally the same as they do in systems 300, 400, and 500.

For example, system 600 includes a first movable structure 604 that is movable relative to a second structure 605, and second structure 605 is movable relative to a reference object (not shown). In some embodiments, first movable structure 604 is a short-stroke component, and second movable structure 605 is a long-stroke component.

System 600 also includes an object holder 606. In some embodiments, object holder 606 is a patterning device support structure of a lithographic apparatus, for example, a mask table or reticle stage. Object holder 606 can be configured to selectively couple with exchangeable object 602. Object holder 606 is configured to be movable relative to first movable structure 604. In some embodiments, object holder 606 is configured to translate along a plane that is generally parallel to the plane (for example, the X-Y plane) in which exchangeable object 602 translates. In some embodiments, object holder 606 is configured to rotate approximately about an axis generally parallel to the X-Y plane.

System 600 also includes a first actuator assembly configured to move object holder 606 relative to first movable structure 604. The first actuator assembly includes one or more first actuators 632 that generate a force to be applied to object holder 606. For example, as shown in FIG. 6, system 600 includes two first actuators 632. Notably, although FIG. 6 depicts two first actuators 632, system 600 can include one first actuator or more than two first actuators in some embodiments. For example, system 600 can include one first actuator 632 that spans an entire width of object holder 606, or system 600 can include two or more actuators 632 that generate parallel force components.

In some embodiments, first actuators 632 can be ultra-short stroke actuators. As shown in FIG. 6, first actuators 632 are coupled to a surface of first movable structure 604. In some embodiments, first actuators 632 are piezoelectric actuators that deform based on applied electric voltages or charges. In some embodiments, first actuators 632 are stack or shear piezoelectric actuators. For example, as shown in FIG. 6, first actuators 632 are shear piezoelectric actuators. In some embodiments, first actuators 632 are configured to generate a force in a direction that is generally parallel to the plane in which exchangeable object 602 translates (for example, the X-Y plane). For example, first actuators 632 can be configured to generate a force that is in a direction generally parallel to the y-axis as shown in FIG. 6.

The first actuator assembly can also include one or more second actuators 634 that generate a force to be applied to object holder 606. In some embodiments, second actuators 634 can be ultra-short stroke actuators. In some embodiments, second actuators 634 are piezoelectric actuators that deform based on applied electric voltages or charges. In some embodiments, second actuators 634 are stack or shear piezoelectric actuators. For example, as shown in FIG. 6, second actuators 634 are shear piezoelectric actuators. In some embodiments, second actuators 634 are configured to generate a force in a direction that is generally parallel to the plane in which exchangeable object 602 translates (for example, the X-Y plane). For example, second actuators 634 can be configured to generate a force that is generally perpendicular to the force generated by first actuators 632. For example, second actuators 634 can generate a force in a direction generally parallel to the x-axis as shown in FIG. 6. In some embodiments, the force components generated by second actuators 634 are generally perpendicular to the force components generated by first actuators 632. Notably, although FIG. 6 depicts two second actuators 634, system 600 can include one second actuator or more than two second actuators, or system 600 can include two or more actuators 632 that generate parallel force components.

In some embodiments, second actuators 634 can be coupled to first actuators 632 such that there is no relative movement between second actuators 634 and first actuators 632. For example, as shown in FIG. 6, intermediate layers 636 can be coupled to a surface of first actuators 632, and second actuators 634 can be coupled to a surface of intermediate layers 636 that is opposite from first actuators 632. In some embodiments, second actuators 634 can be coupled directly to first actuators 632, omitting intermediate layers 636.

System 600 can also include a second actuator assembly configured to adapt the curvature of exchangeable object 602 out of the plane in which exchangeable object 602 translates by applying one or more bending moments to exchangeable object 602. For example, the second actuator assembly can be configured to generate a bending moment approximately about an axis that is parallel to the plane in which exchangeable object 602 translates (for example, the X-Y plane).

As shown in FIG. 6, the second actuator assembly includes a third actuator 628 and a fourth actuator 630. Third and fourth actuators 628 and 630 are each coupled to a surface of second actuators 634 on one end and to object holder 606 on the other end. In some embodiments, third and fourth actuators 628 and 630 are each configured to apply a force in a direction that is generally perpendicular to the plane (for example, the X-Y plane) in which expandable object 602 translates. The variation between the forces applied by the third and fourth actuators 628 and 630 can generate a bending moment that is transferred to object holder 606. This bending moment causes object holder 606 to rotate relative to first movable structure 604. The bending moment may be positive or negative based on the polarity of operation of actuators 628 and 630.

Notably, although FIG. 6 depicts only two actuators 628 and 630, the second actuator assembly can include more than two actuators in some embodiments. In such multiple actuator embodiments, actuators can be spaced around a periphery of exchangeable object 602.

In some embodiments, actuators 628 and 630 are piezoelectric actuators that deform based on applied electric voltages or charges. In some embodiments, actuators 628 and 630 are stack or shear piezoelectric actuator. As shown in FIG. 6, actuators 628 and 630 are stack piezoelectric actuators.

In some embodiments, the second actuator assembly is configured to bend exchangeable object 602 approximately about its neutral axis such that the bending stresses across the thickness of exchangeable object 602 are approximately symmetric. In embodiments in which exchangeable object 602 is a patterning device, such an approximately symmetric stress-distribution will not cause a substantial net stress-birefringence change to occur in the radiation beam that passes through the patterning device. In some embodiments, the net stress-birefringence level is equal to or less than about 5 nm/cm.

A controller 638 can control actuators 628 and 630 and actuators 632 and 634. Controller 638 can be, for example, any suitable programmed microprocessor, microcontroller, or any other suitable analogue or digital control device. In some embodiments, controller 638 controls actuators 628 and 630 and actuators 632 and 634 as described above with reference to controllers 338, 438, and 538. For example, controller 638 can be configured to control actuators 632 and 634 to compensate for slippage between exchangeable object 602 and object holder 606 and for stress in exchangeable object 602 caused by the applied bending moments. Also for example, controller 638 can be configured to control actuators 628 and 630 to apply one or more forces and bending moments to object holder 606 and exchangeable object 602 to elastically deform the shape of exchangeable object 602. In some embodiments, controller 638 controls an adjustable optical element of a projection system as described above with reference to controllers 338, 438, and 538.

In some embodiments, controllers 538 and 638 of systems 500 and 600 can be configured to control actuators 528 and 530, and actuators 628 and 630, respectively, so as to replicate the gravity sag of exchangeable objects 502 and 602 that occurs prior to being coupled to object holders 506 and 606 after exchangeable objects 502 and 602 are coupled to object holders 506 and 606. For example, controllers 538 and 638 can apply set points to actuators 528 and 530, and actuators 628 and 630, respectively, to replicate the gravity sag.

In some embodiments, system 500 can occupy less space in a direction generally perpendicular to the plane in which the exchangeable object translates than system 600.

In some embodiments, systems 500 and 600 can increase the out-of-plane resonances of exchangeable objects 502 and 602, which in turn can improve imaging. In some embodiments, systems 500 and 600 can improve the active damping of the out-of-plane resonances of exchangeable objects 502 and 602, which in turn can also improve imaging.

In some embodiments, systems 500 and 600 can manipulate exchangeable objects 502 and 602 in higher order deformation shapes relative to systems 300 and 400. In some embodiments, systems 500 and 600 are more robust to accelerations relative to systems 300 and 400. In some embodiments, systems 500 and 600 occupy less space than systems 300 and 400 and include less moving mass than systems 300 and 400.

In some embodiments, movable structures 304, 404, 504, and 604 in the above described embodiments are short-stroke component of a patterning device support structure of a lithographic apparatus. In such embodiments, exchangeable objects 302, 402, 502, and 602 can be a patterning device of the lithographic apparatus. For example, referencing FIG. 1, movable structures 304, 404, 504, and 604 can be a short-stroke component of a patterning device support structure MT of lithographic apparatus 1, and exchangeable objects 302, 402, 502, and 602 can be patterning device MA.

In such embodiments, a method of manipulating patterning device MA of lithographic apparatus LA can include applying a force to patterning device 302, 402, 502, or 602 to translate the patterning device generally along a plane. In some embodiments, applying the first force and moving patterning device MA can compensates for an error between a desired position of mask table MT coupled to a patterning device holder that supports patterning devices patterning device MA and a measured position of mask table MT. The method of manipulating patterning device MA can also include applying a bending moment to patterning device MA to bend the patterning device MA. Applying the bending moment bends patterning device MA, which can compensate for an imaging error. In some embodiments, applying the first force also compensates for an error between a desired position of the patterning device holder that supports patterning device MA and a measured position of the measured position of the patterning device holder. In some embodiments, the imaging error being compensated for is a field curvature error. In some embodiments, applying the first force also compensates for slippage between MA and the object holder of the pattering device support MT caused by the bending moment.

Embodiments of controllers 338, 438, 538, and 638 may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system for manipulating an exchangeable object, comprising:
   a movable short-stroke component of a positioning system of a lithographic apparatus;
   an object holder configured to move relative to the movable short-stroke component and to hold the exchangeable object;
   a first actuator assembly configured to apply a force to the object holder to translate, relative to the movable short-stroke component, the exchangeable object along a plane; and
   a second actuator assembly configured to apply a first bending moment to the exchangeable object to manipulate a curvature of the exchangeable object.

2. The system of claim 1, wherein the second actuator assembly is configured to apply a second bending moment to the exchangeable object on a side of the exchangeable object opposite from the first bending moment, and wherein the second bending moment is in a direction opposite of a direction of the first bending moment.

3. The system of claim 1, wherein the first actuator assembly comprises:
an actuator coupled to the movable short-stroke component and between the movable short-stroke component and the object holder; and
a connecting structure rigid in the plane and compliant along an axis perpendicular to the plane, the connecting structure coupling the actuator to the object holder.

4. The system of claim 3, wherein the actuator is a shear piezoelectric actuator.

5. The system of claim 3, wherein the connecting structure is a leaf spring.

6. The system of claim 1, wherein the second actuator assembly comprises:
an intermediate structure;
a connecting structure rigid in the plane, compliant along an axis perpendicular to the plane, and coupling the movable short-stroke component to the intermediate structure; and
an actuator that couples the movable short-stroke component to the intermediate structure, wherein the actuator is configured to apply a second force to the intermediate structure to generate the first bending moment,
wherein the intermediate structure is coupled to the object holder and to the exchangeable object such that the first bending moment is transferred from the intermediate structure to the exchangeable object.

7. The system of claim 6, wherein the second actuator assembly further comprises a plurality of pins coupling the intermediate structure to the exchangeable object, compliant in the plane, and rigid along the axis perpendicular to the plane such that the first bending moment can be transferred from the intermediate structure to the exchangeable object.

8. The system of claim 7, further comprising an elastic member between the intermediate structure and the object holder, and configured to preload the exchangeable object against the plurality of pins.

9. The system of claim 6, wherein the actuator is a stack piezoelectric actuator configured to apply the second force in a direction parallel to the plane.

10. The system of claim 9, wherein the second actuator assembly further comprises a serial spring positioned between the actuator and the movable structure.

11. The system of claim 6, wherein:
the second actuator assembly further comprises a second connecting structure configured to be generally rigid in the plane, the second connecting structure also being configured to be generally compliant along the axis that is generally perpendicular to the plane, the second connecting structure being coupled to the actuator and to the intermediate structure; and
the actuator being coupled to the movable short-stroke component.

12. The system of claim 11, wherein the actuator is a shear piezoelectric actuator.

13. The system of claim 11, wherein the second connecting structure is a leaf spring.

14. The system of claim 1, wherein the second actuator assembly comprises:
an intermediate structure; and
first and second actuators coupled to the movable short-stroke component and to the intermediate structure, the first actuator being configured to apply a second force to the intermediate structure in a direction generally perpendicular to the plane, the second actuator being configured to apply a third force to the intermediate structure in the direction generally perpendicular to the plane,
wherein a variation between the second force and the third force generates the first bending moment, and
wherein the intermediate structure is coupled to the object holder and to the exchangeable object such that the first bending moment is transferred from the intermediate structure to the object holder and to the exchangeable object.

15. The system of claim 14, wherein the first and second actuators are stack piezoelectric actuators.

16. The system of claim 14, wherein the second actuator assembly further comprises a plurality of pins coupled to the intermediate structure and configured to contact the exchangeable object, the plurality of pins being configured to be generally compliant in the plane, the plurality of pins also being configured to be generally rigid along the axis that is generally perpendicular to the plane such that the first bending moment can be transferred from the intermediate structure to the exchangeable object.

17. The system of claim 16, further comprising an elastic member coupled to the intermediate structure and to the object holder, the elastic member being configured to preload the exchangeable object against the plurality of pins.

18. The system of claim 1, wherein:
the first actuator assembly comprises:
a first shear piezoelectric actuator coupled to the movable short-stroke component, the first shear piezoelectric actuator being configured to generate a first force component of the force applied to the object holder in the direction generally parallel to the plane; and
a second shear piezoelectric actuator coupled to the first shear piezoelectric actuator, the second shear piezoelectric actuator being configured to generate a second force component of the force applied to the object holder in the direction generally parallel to the plane; and
the second actuator assembly comprises:
first and second stack piezoelectric actuators coupled to the object holder and to the second shear piezoelectric actuator,
wherein the first stack piezoelectric actuator is configured to apply a third force to the object holder in a direction generally perpendicular to the plane,
wherein the second stack piezoelectric actuator is configured to apply a fourth force to the object holder in the direction generally perpendicular to the plane defined by the first axis and the second axis, and
wherein a variation between the third force and the fourth force generates the first bending moment.

19. The system of claim 18, wherein the direction of the second force component is generally perpendicular to the direction of the first force component.

20. The system of claim 18, wherein the first actuator assembly further comprises:
a third shear piezoelectric actuator coupled to the movable short-stroke component, the third shear piezoelectric actuator being configured to generate a third force component of the force applied to the object holder in the direction generally parallel to the plane, the third force component being generally parallel with the first force component; and a fourth shear piezoelectric actuator coupled to the movable short-stroke component, the fourth shear piezoelectric actuator being configured to generate a fourth force component of the force applied to the object holder in the direction generally parallel to the plane, the fourth force component being generally parallel with the second force component.

21. The system of claim 20, further comprising a controller configured to control the first, second, third, and fourth shear piezoelectric actuators to compensate for slippage between the exchangeable object and the object holder or for stress in the exchangeable object caused by the first bending moment.

22. The system of claim 18, further comprising a controller configured to control the first and second shear piezoelectric actuators and the first and second stack piezoelectric actuators to apply one or more forces and one or more bending moments to the object holder and the exchangeable object to elastically deform the shape of the exchangeable object.

23. The system of claim 1, further comprising a controller configured to control the first actuator assembly to compensate for slippage between the exchangeable object and the object holder caused by the first bending moment or for stress in the exchangeable object caused by the first bending moment.

24. The system of claim 1, further comprising a controller configured to control the first actuator assembly to dynamically position the exchangeable object to match a reference position.

25. The system of claim 1, further comprising a controller configured to control the second actuator assembly to dynamically bend the exchangeable object to match a reference curvature.

26. The system of claim 1, wherein the exchangeable object is a patterning device for use in the lithographic apparatus.

27. A lithographic apparatus comprising:
a system configured to manipulate a patterning device configured to impart a radiation beam with a pattern in its cross-section to form a patterned radiation beam, the system comprising:
a movable short-stroke component;
a patterning device holder configured to move relative to the movable short-stroke component and to hold the patterning device;
a first actuator assembly configured to apply a force to the patterning device holder to translate, relative to the movable short-stroke component, the patterning device along a plane; and
a second actuator assembly configured to apply a bending moment to the patterning device.

28. The lithographic apparatus of claim 27, wherein the patterning device is a reticle.

29. The lithographic apparatus of claim 27, wherein the first actuator assembly comprises:
an actuator coupled to the movable short-stroke component and between the movable short-stroke component and the patterning device holder; and
a connecting structure rigid in the plane, and compliant along an axis perpendicular to the plane, wherein the connecting structure couples the actuator to the patterning device holder.

30. The lithographic apparatus of claim 27, wherein the second actuator assembly comprises:
an intermediate structure;
a connecting structure rigid in the plane, complaint along an axis perpendicular to the plane, and coupling the movable short-stroke component to the intermediate structure; and
an actuator being configured to apply a second force to the intermediate structure to generate the bending moment,
wherein the intermediate structure is coupled to the patterning device holder and to the patterning device such that the bending moment is transferred from the intermediate structure to the patterning device.

31. The lithographic apparatus of claim 27, wherein the second actuator assembly comprises:
an intermediate structure; and
first and second actuators coupled to the movable short-stroke component and to the intermediate structure, the first actuator being configured to apply a second force to the intermediate structure in a direction generally perpendicular to the plane, the second actuator being configured to apply a third force to the intermediate structure in the direction generally perpendicular to the plane,
wherein a variation between the second force and the third force generates the bending moment, and
wherein the intermediate structure is coupled to the patterning device holder and to the patterning device such that the bending moment is transferred from the intermediate structure to the patterning device holder and to the patterning device.

32. The lithographic apparatus of claim 27, wherein:
the first actuator assembly comprises:
a first shear piezoelectric actuator coupled to the movable short-stroke component, the first shear piezoelectric actuator being configured to generate a first force component of the force applied to the object holder in the direction generally parallel to the plane; and
a second shear piezoelectric actuator coupled to the first shear piezoelectric actuator, the second shear piezoelectric actuator being configured to generate a second force component of the force applied to the patterning device holder in the direction generally parallel to the plane; and
the second actuator assembly comprises:
first and second stack piezoelectric actuators coupled to the patterning device holder and to the second shear piezoelectric actuator,
wherein the first stack piezoelectric actuator is configured to apply a second force to the patterning device holder in a direction generally perpendicular to the plane,
wherein the second stack piezoelectric actuator is configured to apply a third force to the patterning device holder in the direction generally perpendicular to the plane defined by the first axis and the second axis, and
wherein a variation between the second force and the third force generates the bending moment.

33. The lithographic apparatus of claim 27, further comprising a controller configured to control the first actuator assembly to compensate for slippage between the patterning device and the patterning device holder or for stress in the patterning device caused by the bending moment.

34. A mount for mounting an exchangeable object on a movable structure of a lithographic apparatus, the mount comprising:
a holder configured to hold the exchangeable object; and
an assembly coupled to the holder and comprising:

a bender configured to apply a bending moment to the exchangeable object for changing a curvature of the exchangeable object; and a shifter configured to apply a force to the holder for moving the exchangeable object in a plane relative to the movable structure, wherein the bender is integrated with the shifter and, when in use, enables adaptive clamping of the exchangeable object by the holder.

35. The mount of claim 34, wherein:
the holder comprises a clamp;
the bender is configured to deform the exchangeable object substantially about a neutral axis of the exchangeable object for actively changing the curvature of the exchangeable object; and
the shifter is configured to actively shift the exchangeable object in the plane.

36. The mount of claim 34, wherein:
the holder comprises a clamp positioned at a first location;
the shifter comprises a shear piezoelectric actuator positioned at a second location offset from the first location in the plane and coupled to the clamp by a first leaf spring, the shear piezoelectric actuator being configured to move the exchangeable object and follow deformations of the exchangeable object caused by bending the exchangeable object.

37. The mount of claim 36, wherein:
the bender comprises an intermediate structure and a plurality of in-plane compliant pins attached to the intermediate structure; and
the bender dynamically adapts the curvature of the exchangeable object during exposure of a substrate.

38. The mount of claim 36, wherein the bender comprises:
an intermediate structure; and
a second piezoelectric actuator with a serial spring positioned on a side of the shear piezoelectric actuator opposite from the exchangeable object, the second piezoelectric actuator being coupled to the intermediate structure.

39. The mount of claim 34, wherein the exchangeable object is configured for imparting a radiation beam with a pattern in a cross-section of the radiation beam to expose a substrate with the pattern, and wherein the mount is a compliant or kinematic mount that is configured to control the shape of the exchangeable object mounted thereon for dynamic mounting thereof in the lithographic apparatus.

40. The mount of claim 34, wherein:
the holder comprises a clamp positioned at a first location; and
the shifter comprises first and second shear piezoelectric actuators positioned at a second location offset from the first location in the plane and coupled to the clamp by a first leaf spring, the first and second shear piezoelectric actuators being configured for moving the exchangeable object along first and second axes of a coordinate system in the plane, respectively.

41. The mount of claim 40, wherein the bender comprises:
a third shear piezoelectric actuator positioned at a third location offset from the first location in the plane;

an intermediate structure coupled to the third shear piezoelectric actuator by second and third leaf springs; and
a plurality of pins attached to the intermediate structure, and compliant in the plane;
wherein the third shear piezoelectric actuator is configured for bending the exchangeable object about the first axis; and
wherein the bender is configured to dynamically adapt the shape of the exchangeable object during exposure of a substrate.

42. The mount of claim 41, wherein the assembly further comprises a spring compliant along the first and second axes of the coordinate system and configured to apply a preload force in a direction along a third axis of the coordinate system.

43. The mount of claim 34, wherein:
the bender comprises a first stacked configuration of a first stack piezoelectric actuator configured to apply a push-pull force for bending the exchangeable object; and
the shifter comprises a first pair of first and second shear piezoelectric actuators to move the exchangeable object along first and second axes of a coordinate system by following deformation created by bending the exchangeable object.

44. The mount of claim 43, wherein:
the bender further comprises a second stacked configuration of a second stack piezoelectric actuator to apply a push-pull force for bending the exchangeable object; and
the shifter further comprises a second pair of first and second shear piezoelectric actuators to move the exchangeable object in the first and second axes of the coordinate system by following deformation created by bending the exchangeable object.

45. The mount of claim 34, wherein:
the holder further comprises a clamp positioned at a first location; and
the shifter comprises first and second shear piezoelectric actuators positioned at a second location offset from the first location in the plane and coupled to the clamp by a leaf spring, the first and second shear piezoelectric actuators being configured for moving the exchangeable object along first and second axes of a coordinate system in the plane, respectively.

46. The mount of claim 45, wherein the bender comprises:
an intermediate structure;
a plurality of pins attached to the intermediate structure, and compliant in the plane; and
a pair of stack piezoelectric actuators positioned on a side of the intermediate structure opposite from the exchangeable object, the pair of stack piezoelectric actuators being configured to act in a direction of a third axis of the coordinate system, and to dynamically bend the exchangeable object to adapt the curvature of the exchangeable object during exposure of a substrate.

47. The mount of claim 34, wherein the holder comprises a clamp having a vacuum cup with a leaky seal.

* * * * *